(12) United States Patent
Boroczki et al.

(10) Patent No.: US 9,437,615 B2
(45) Date of Patent: Sep. 6, 2016

(54) HIGH INTENSITY DISCHARGE LAMPS WITH DOSING AID

(71) Applicant: General Electric Company, Schenectady, NY (US)

(72) Inventors: Agoston Boroczki, Budapest (HU); Peter Horvath, Budapest (HU); Istvan Kerenyi, Budapest (HU); Sandor Sebok, Budapest (HU); Anna Inczedy, Budapest (HU)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 135 days.

(21) Appl. No.: 14/296,166

(22) Filed: Jun. 4, 2014

(65) Prior Publication Data

US 2015/0357178 A1    Dec. 10, 2015

(51) Int. Cl.
*H01J 17/20*    (2012.01)
*H01L 27/12*    (2006.01)

(52) U.S. Cl.
CPC .................. *H01L 27/1214* (2013.01)

(58) Field of Classification Search
CPC .................................................. H01L 27/1214
USPC ................... 313/637, 640, 546, 549
See application file for complete search history.

(56) References Cited

U.S. PATENT DOCUMENTS

| 5,592,049 A * | 1/1997 | Heider et al. ................. 313/625 |
| 6,356,016 B1 | 3/2002 | Suijker et al. |
| 6,362,571 B1 | 3/2002 | Suijker et al. |
| 7,868,553 B2 | 1/2011 | Russell et al. |
| 2010/0013417 A1 | 1/2010 | Ramaiah et al. |

* cited by examiner

*Primary Examiner* — Vip Patel
(74) *Attorney, Agent, or Firm* — GE Global Patent Operation; Peter T. DiMauro

(57) ABSTRACT

A ceramic metal halide lamp according to various embodiments can include a discharge vessel and an ionizable fill. The ionizable fill is sealed within the discharge vessel. The ionizable fill includes an oxygen dispenser to introduce oxygen in a form of a pellet into the discharge vessel in a controlled manner to facilitate a tungsten halogen wall cleaning cycle. The pellet comprises aluminum-oxide and molybdenum-oxide.

19 Claims, 4 Drawing Sheets

HIGH INTENSITY DISCHARGE LAMPS WITH DOSING AID

I. FIELD OF THE INVENTION

The present disclosure relates generally to a high intensity discharge lamp with high lumen maintenance. More particularly, the present disclosure relates to a ceramic metal halide (CMH) lamp with a source of available oxygen in the fill that exhibits high luminous flux maintenance over the useful lamp life.

II. BACKGROUND OF THE INVENTION

Many known discharge lamps produce light by ionizing a vaporous fill material, such as a mixture of rare gases, metal halides and mercury with an electric arc passing between two electrodes. The electrodes and the fill material are sealed within a translucent or transparent discharge vessel that maintains the pressure of the energized fill material and allows the emitted light to pass through it. The ionizable fill material, also known as a "dose," emits a desired spectral energy distribution in response to being excited by the electric arc. For example, halides provide spectral energy distributions that offer a broad choice of light properties, e.g. color temperatures, color renderings, and luminous efficacies.

High Intensity Discharge (HID) lamps are high-efficiency lamps that can generate large amounts of light from a relatively small source. These lamps are widely used in many applications, including highway and road lighting, lighting of large venues such as sports stadiums, floodlighting of buildings, shops, industrial buildings, and projectors, to name but a few. The term "HID lamp" is used to denote different kinds of lamps. These include mercury vapor lamps, metal halide lamps, and high pressure sodium lamps. HID lamps differ from other lamps because their functioning environment requires operation at high temperature and high pressure over a prolonged period of time.

Ceramic discharge chambers for HID lamps have been developed to operate at higher temperatures for improved color temperatures, color renderings, and luminous efficacies, while significantly reducing reactions with the fill material. Such lamps with ceramic discharge chambers have been termed "CMH HID" lamps. Metal halide (e.g., CMH) lamps are widely used because they may have a higher efficiency than incandescent lamps. This is economically and environmentally beneficial.

These lamps, however, may sometimes experience reduced light output over time (typically, expressed as lumen maintenance) due to darkening of the inside of the discharge chamber walls. This darkening is due to tungsten being transported from the tip of the electrode during operation to the inside wall, blocking light. Oxygen within the interior space may aid in cleaning the wall and thus can improve lumen maintenance over the lifetime of the lamp. It has been proposed to introduce a calcium oxide or tungsten oxide dispenser in the discharge vessel, as disclosed, for example in WO 99/53522 and WO99/53523. This has been also achieved in an exemplary embodiment with improved lumen maintenance in U.S. Pat. No. 7,868,553 and US Patent Publication 2010/0013417, each of which has a common assignee as the present disclosure.

During the operation of CMH lamps, oxygen is dispensed within the discharge vessel to facilitate a wall-cleaning cycle, which reduces blackening of the discharge chamber walls and extends the lamp life. In such a process, with the aid of an oxygen additive in the fill, the tungsten (W) electrode material deposited on the CMH discharge vessel wall creates tungsten-oxyhalides with the available free halogen and oxygen. Tungsten-oxyhalides have relatively high vapor pressure at the wall operating temperature of a CMH discharge vessel (~1300K). The evaporated tungsten-oxyhalides will diffuse back to the arc region of the CMH discharge vessel, dissociate at extremely high temperature (~5000K) of the arc, and finally, re-deposit elemental tungsten on the electrode surface.

The discharge vessel wall is continuously cleaned due to the fact that the tungsten electrode tip evaporation operates continuously in a closed cycle. Initially, tungsten deposits on the discharge vessel wall, which is then followed by the tungsten being transported back from the wall to the electrode tip with the help of the evaporated tungsten-oxyhalides. Thus, the discharge vessel wall is continuously cleaned. This prevents (or completely reduces) wall blackening and improves luminous flux (lumen) maintenance of, especially, "Ultra" branded CMH lamps.

However, this wall-cleaning tungsten halogen chemical cycle only operates in a rather narrow oxygen concentration range. If the oxygen concentration is too low, the cycle does not operate efficiently. More tungsten is evaporated than the amount of tungsten transported back to the W electrode tip. If the oxygen concentration is too high, then the cycle even erodes the cooler parts of the electrode assembly. Too high of an oxygen concentration may also enhance the K diffusion in the tungsten electrode shank. This creates macroscopic K bubbles, which can lead to breakage of the electrode shank. This situation has been observed in some low watt "Ultra" CMH lamps.

Therefore, typically, the nominal power at which the lamp is designed to function determines the quantity of oxygen required within the interior chamber of the vessel. Generally, too much oxygen in the interior space of a discharge vessel of a lamp lowers initial lumens, but too little available oxygen lowers lumen maintenance.

Because of the narrow oxygen concentration range of the wall-cleaning cycle, it is important to accurately dose oxygen into the discharge vessel. The dosing process must also be compatible with standard manufacturing procedures of CMH lamps.

Despite the superlative lumen maintenance shown by many of the lamps described in the above-noted commonly assigned patent and patent publications, there is generally a desire for even higher efficacy and longer life for CMH lamp. There also remains a desire for a system and method to provide accurate oxygen dosing of "Ultra" type CMH lamps with improved luminous flux maintenance over the useful lamp life. There also remains a desire to provide an effective dose measuring method for accurately measuring an oxygen dose for use with a CMH lamp.

In some of the tungsten oxide dispenser mentioned above, oxygen dosing in "Ultra" CMH lamps is currently implemented by adding tungsten-oxide to metal halide dose pellets. However, due to chemical incompatibility of $WO_x$ (x=~2.87) with some of the metal halide dose components (lanthanum, in particular) and the technical difficulties in pellet preparation, the current metal halide dose pellet supplier is only capable of producing $NaI-WO_x$ pellets. Therefore $WO_x$ is dosed in $NaI-WO_x$ pellets and a rest of the metal halides are dosed in a second type of pellet, for example $NaI-TlI-LaI_3-CaI_2$.

Due to this double-dosing process, any error in the dosing process (miss-counting of pellets, non-uniformity of mass, chemical composition or geometry of pellets) causes variations in metal halide molar ratio in the total dose fill. This dosing error can considerably modify the spectrum emitted from the dosing component. High spectral variance of emitted light then leads to color and lumen variations, in particular variations of the correlated color temperature (CCT).

III. SUMMARY OF THE EMBODIMENTS OF THE INVENTION

Given the aforementioned deficiencies, a need exists for a system and method wherein all the light-emitting (metal) components of the dose fill can be added into the CMH discharge vessel as a single pellet type. Such a system may reduce the compositional variation of the total dose fill of the "Ultra" CMH lamps, and consequently, reduce the lamp-to-lamp color variation, even if the number of dosed pellets is not accurate. A need also exists for systems and methods to dose oxygen either in the same pellet or in a completely independent manner.

In addition to the double-dosing pellet preparation method, other oxygen dosing methods exist. For example, some methods dose oxygen via an HgO compound. Other methods rely upon gas-phase oxygen dosing in a linear (or modified static) CMH sealing furnace. However, these methods suffer several disadvantages such as inaccurate dosing and multiple complex process steps.

Therefore, it remains desirable to provide a ceramic based dosing aid that overcomes the above shortcomings. For example, it may be desirable to provide a technique that is relatively efficient and simple in terms of design and implementation and best fits the current CMH production process.

In certain embodiments, a ceramic metal halide lamp can include a discharge vessel and an ionizable fill. The ionizable fill is sealed within the discharge vessel. The ionizable fill includes an oxygen dispenser to introduce oxygen in a form of a pellet into the discharge vessel in a controlled manner to facilitate a tungsten halogen wall cleaning cycle. The pellet comprises aluminum-oxide and molybdenum-oxide.

In other embodiments, a method is provided for preparing a dosing pellet, which includes mixing aluminum-oxide and molybdenum-oxide with a binder to form a mixture; pressing the mixture to form a pellet; heat treating the pellet to remove the binder from the pellet; and grinding the pellet to form the pellet having a spheroidal shape.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

Figure 1:
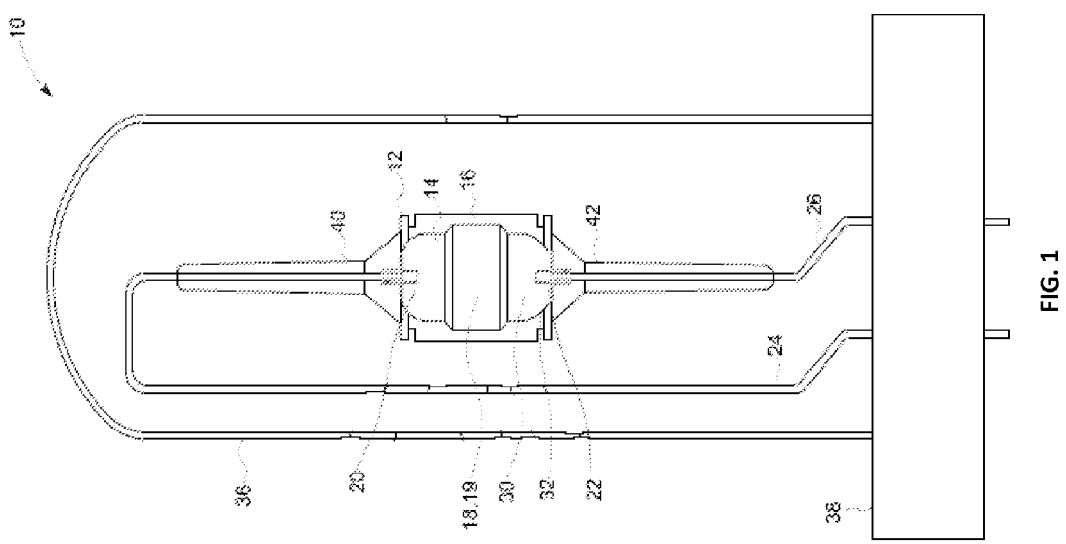
FIG. 1 is an exemplary embodiment of a schematic of CMH HID lamp in accordance with the present disclosure.

The present disclosure may take form in various components and arrangements of components, and in various process operations and arrangements of process operations. The present disclosure is illustrated in the accompanying drawings, throughout which, like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

V. DETAILED DESCRIPTION OF VARIOUS EMBODIMENTS

The following detailed description is merely exemplary in nature and is not intended to limit the applications and uses disclosed herein. Further, there is no intention to be bound by any theory presented in the preceding background or summary or the following detailed description.

Various embodiments enable accurate dosing of oxygen into long-life "Ultra" type CMH lamps to improve luminous flux maintenance throughout the useful lamp life. In various embodiments, a wall-cleaning tungsten halogen chemical cycle is employed in such lamps with the aid of an oxygen additive to fill the discharge vessel of the lamp.

Various embodiments provide the application of a ceramic based dosing aid, with the aid of very small amounts, such as parts per million (ppm) of oxygen-containing substances, which can be easily dosed into the CMH discharge vessel, to facilitate the halogen clean-up cycle. In addition to dispensing oxygen, various embodiments of the ceramic dosing aid can also be used to introduce excess metal or other radiating dose components of extremely low quantities into the CMH discharge vessel. For example, additional dose constituents may include excess metal for gettering unwanted impurities in the discharge chamber, as well as other additional filling component, or a combination thereof.

In various embodiments, the ceramic based dosing aid typically comprises a ceramic particle preferably having a spheroidal geometry, which is shaped like a sphere but is not perfectly round having the shape of an ellipsoid. Those skilled in the art would recognize that the pellet may have a variety of shapes and sizes. For example, in various embodiments, the pellet may be spherical, oval, uniform or non-uniform configurations. These examples are exemplary and nonlimiting.

In various embodiments, the ceramic particle comprises the form, for example, of a pellet, having interstitial voids within the structure. In the preferred embodiment, the ceramic dosing aid for the CMH lamp is a heat treated ceramic sphere of "spongy" internal structure, which is made of alumina ($Al_2O_3$). In various embodiments, the interstitial voids of the spongy structure is configured to receive (i.e., take in) the low quantity dose components. Other embodiments may include a solid sphere with the dose component deposited onto its surface.

Various embodiments provide a method for producing the spheroidal alumina dosing aid. The process may include one or more of the following steps of: mixing aluminum-oxide and molybdenum-oxide powder, pressing the mixture into pellets, heating the pellets, grinding the pellets to form a spherical shape, trommeling to separate the pellets by size, and selecting the desired size. In the preferred method, aluminum-oxide is mixed with molybdenum-trioxide ($MoO_3$).

Various embodiments provide a device and method for applying a ceramic based dosing aid of spheroid geometry with an oxygen-compound additive (preferably molybdenum-oxide, more preferably an $MoO_3$ additive), which can easily be adapted to the dosing technique of similarly sized and shaped metal halides, for example, by introducing an additional automatic doser into the flow process.

With reference to FIG. 1A, a cross-sectional view of an exemplary CMH HID lamp 10 is shown. Such lamp embodies a common, but nonlimiting, configuration for lamps in accordance with this disclosure. The exemplary lamp includes a discharge vessel (or arc tube) 12, which defines an interior space 14. The discharge vessel 12 has a wall 16 formed of a ceramic material, such as alumina. An ionizable fill 18 is sealed in the interior space 14. The ionizable fill 18 also includes an oxygen dispenser containing a ceramic dosing aid component 19, for example, alumina containing molybdenum-oxide, sealed within the interior space 14. Prior to enclosing the discharge vessel 12, a ceramic dosing aid, preferably in the form of a pellet or pellets, is provided within the interior space 14.

Electrodes (typically comprising tungsten) denoted 20, 22 are positioned at opposite ends of the discharge vessel so as to energize the fill when an electric current is applied thereto. The two electrodes 20 and 22 are typically fed with an alternating electric current via conductors 24, 26 (e.g., from a ballast, not shown). When the HID lamp 10 is powered, indicating a flow of current to the lamp, a voltage difference is created across the two electrodes. This voltage difference causes an arc across the gap between the tips of the electrodes. The arc results in a plasma discharge in the region between electrode tips (not shown). Visible light is generated and passes out of the interior space 14, through the wall 16.

The electrodes become heated during lamp operation and tungsten tends to vaporize from the tips. Some of the vaporized tungsten may deposit on an interior surface 32 of wall 16. Absent a regeneration cycle, the deposited tungsten may lead to wall blackening and a reduction in the transmission of the visible light. The exemplary arc tube 12 is surrounded by an outer bulb 36 that is provided with a lamp cap 38 at one end, through which the lamp is connected with a source of power (not specifically shown). The bulb 36 may be formed of glass or other suitable material. The lighting system also generally includes a ballast (not specifically shown), which may also act as a starter when the lamp is switched on. The ballast is located in a circuit that includes the lamp and the power source. The space between the arc tube and outer bulb may be evacuated.

Figure 2:
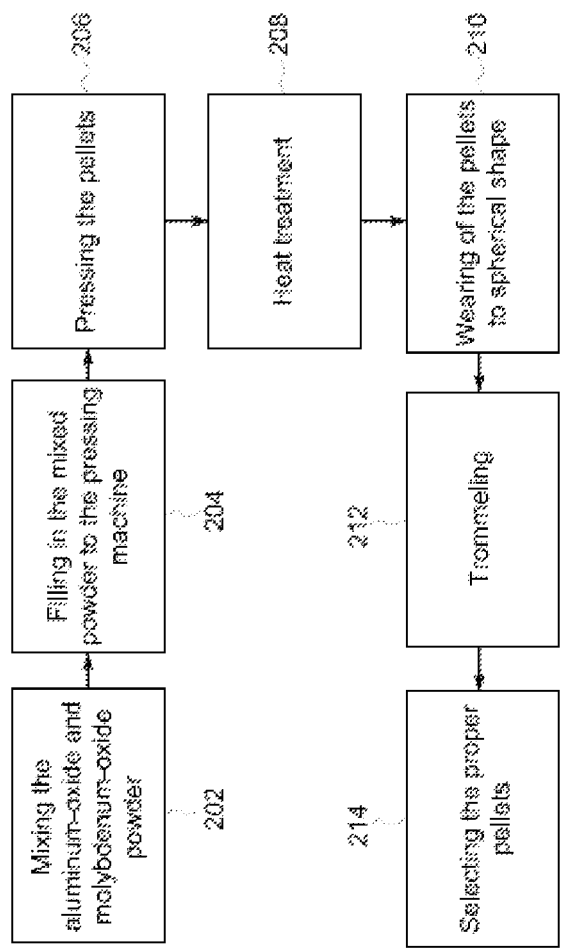
FIG. 2 is a block diagram illustrating an exemplary method of manufacturing dose pellets in accordance with the present disclosure.

FIG. 2 is an exemplary method 200 of manufacturing the pellets of the ceramic dosing aid component in accordance with the present teachings. In various embodiments of the pellet preparation process, the ceramic based dosing aid typically comprises a ceramic particle preferably having a spheroidal geometry. The ceramic particle comprises the form, for example, of a pellet, wherein the surface and the interstitial voids absorb or take in the low quantity dose components. In the preferred embodiment, the ceramic dosing aid for the CMH lamp is a heat treated ceramic sphere of "spongy" internal structure, which is made of alumina ($Al_2O_3$). Other embodiments may include a solid sphere with the dose component deposited onto its surface.

In step 202 of the exemplary method, an alumina ($Al_2O_3$) and molybdenum-oxide powder, preferably molybdenum-trioxide ($MoO_3$) are mixed with a binder to form a powder mixture. In step 204, the powder mixture is transferred to a pressing machine. Binders, which may be used individually or in combination, can include, for example, organic polymers such as polyols, polyvinyl alcohol, vinyl acetates, acrylates, cellulosics and polyesters.

In step 206, the powder mixture is pressed to form pellets having a shape of a small cylinder. An additional important design parameter is the molybdenum-oxide concentration of the ceramic dosing aids. The geometry of the pellet is determined by the required pellet diameter, in most cases 0.4-0.6 mm, therefore the required oxygen quantity can be set be adjusting the $MoO_3$ concentration in the $Al_2O_3$ carrier. In one embodiment, the target oxygen quantity was 0.28 μmol in one pellet, therefore 0.28/3=0.093 μmol=0.0136 mg $MoO_3$ was mixed into a pellet of 0.1 mg total weight. The powder mixing ratio to achieve it was 0.0136/0.1=13.6 wt % $MoO_3$ and 86.4 wt % $Al_2O_3$. The powder $MoO_3$ concentration can be in the range of 2-20 wt % $MoO_3$, and the total oxygen quantity in the lamp necessary for optimal lumen maintenance is between 0.5 and 10 μmol/cm$^3$ per arc tube volume.

For example, the volume of the 35 W arc tube used for the example below was 0.13 cm$^3$ and the quantity of elemental oxygen in the arc tube was 0.28 μmol (for a density of 2.15 μmol/cm$^3$). The pressing process in step 206 can be either volumetric or pressure controlled to achieve the described molybdenum-oxide concentration. Test results demonstrated that the pressure controlled process results in more consistent ceramic dosing aid material density and molybdenum-oxide quantity.

In step 208, the pellets, which may resemble cylinders at this stage of the process, are then subjected to heat treatment at moderate temperatures so that the binder is removed, but the molybdenum-oxide additive is not decomposed. This heat treatment increases the mechanical strength of the small ceramic cylinder to withstand forces applied during a grinding process in step 210. The grinding process removes the "corners" from the cylinders. This shapes the ceramic dosing aid geometry to a have "spheroidal shape", for use with automatic pellet dosers designed in accordance with the present teachings.

In step 212, the pellets are separated by size by means of a trommel in order to select the proper pellet size in step 214. It is preferable that the pellet size is selected to have a diameter smaller than the dosing tubes 40 and 42 (FIG. 1A) (i.e., leg bores), which extend into opposite ends of the CMH discharge vessel 12.

Prior to enclosing the discharge vessel 12, the ceramic dosing aid, preferably in the form of a pellet or pellets, is provided within the interior space 14 by way of insertion through dosing tubes 40, 42. When fully assembled, the electrodes 20, 22 are mounted inside the dosing tubes 40, 42.

Once the discharge vessel is sealed and the CMH lamp is completely assembled, oxygen is released from the molybdenum-oxide additive of the ceramic dosing aids during operation of the lamp. In the first few hundred hours of lamp operation metal-oxide slowly diffuses out of the ceramic voids and is decomposed in the arc temperature, releasing free oxygen available for the tungsten-oxy-halide cycle. The oxygen release rate may depend upon several parameters of the ceramic dosing aid, for example, porosity, molybdenum-oxide concentration, geometrical dimensions, the number of pills dosed, etc.

The prolonged release of oxygen may prevent unwanted effects common for NaI—$WO_x$-based dosing method such as electrode thinning due to high initial oxygen concentration and initial lumen drop due to rapidly evaporating and depositing $WO_x$. It is estimated that the ceramic carrier is completely dissolved in the liquid metal-halide dose in the first 2000 hours of lamp operation, therefore all available oxygen is released within this time.

Figure 3:
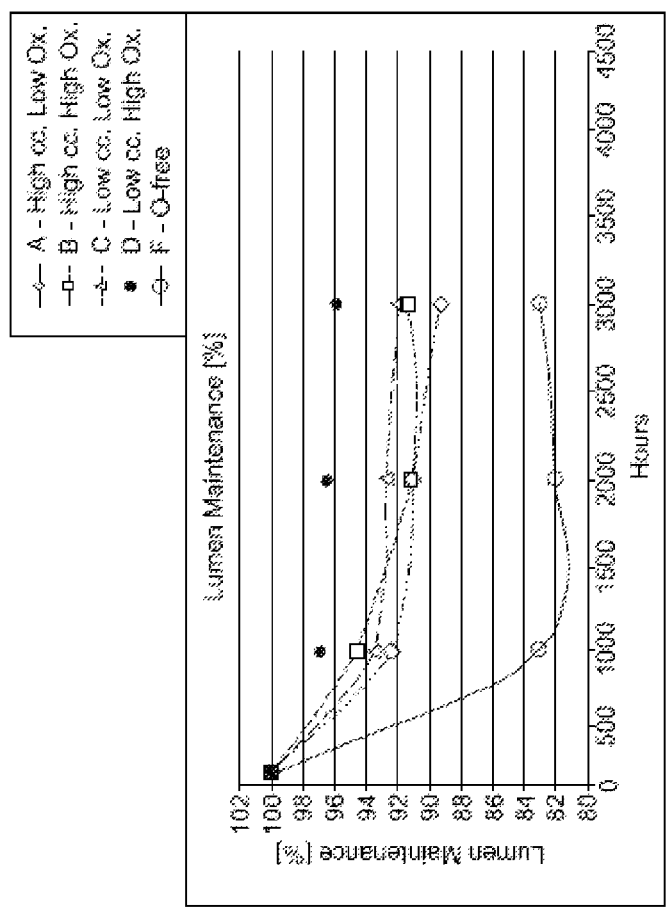
FIG. 3 is a plot of lumen maintenance expressed as a percent (LM %) versus time in accordance with the present disclosure.

FIG. 3 demonstrates the enhancement in lumen maintenance for the $Al_2O_3$—$MoO_3$-pellet-doped "Exemplary Lamps" (denoted as A, B, C, and D in FIG. 3) in contrast to the oxygen-free lamp (denoted as F in FIG. 3). Lamps in batch A and B were doped with one and two pellet(s) of high (13.6 wt %) $MoO_3$ concentration respectively, whereas batch C and D were doped with 5 and 8 pellets of low (2.7 wt %) $MoO_3$ concentration, respectively. The average pellet mass was 0.1 mg in all cases, therefore total oxygen quantity in the lamps was 0.28 and 0.56 µmol in batch A and B, and 0.28 and 0.45 µmol in batch C and D, respectively.

Notable in FIG. 3 is the fact that substantially 88%-96% of initial lumens had been maintained at 3000 hours for the Exemplary Lamps. In FIG. 3, the oxygen-free lamp showed a drop in lumens and lumen percentage over the test while the Exemplary Lamps exhibited a much improved lumen maintenance. It is also noticeable that higher total oxygen quantity improves lumen maintenance. Lamps in batch D has the best long-term lumen maintenance which indicates that the number of pellets also plays a role in lumen maintenance. The higher pellet surface is expected to increase oxygen release rate form the porous ceramic carrier, therefore improving lumen maintenance in the first 1000 hours of lamp life.

Figure 4:
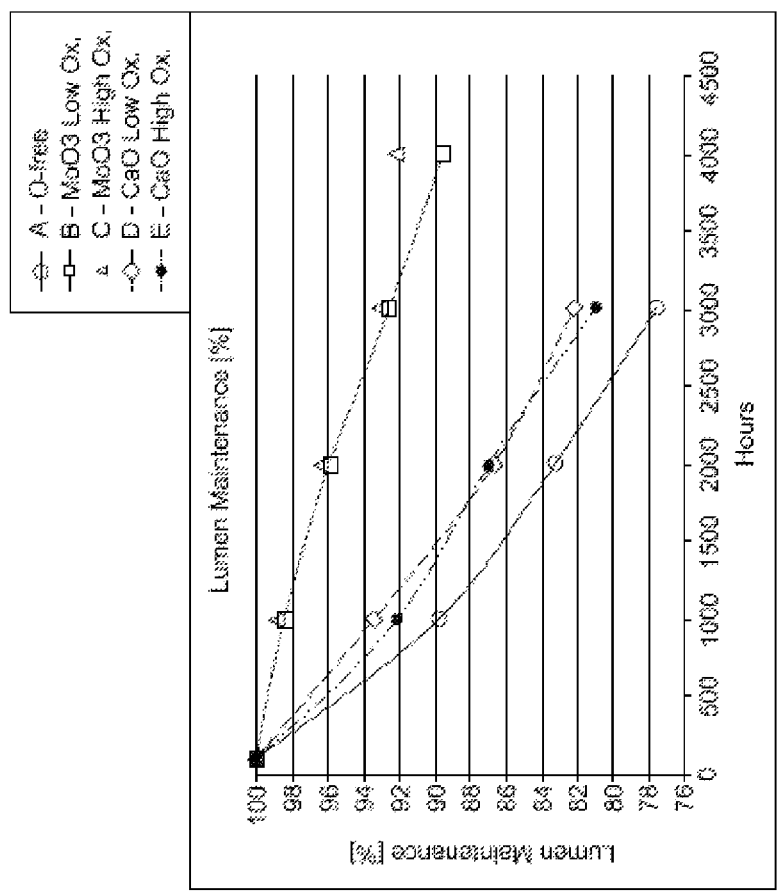
FIG. 4 is a plot of lumen maintenance expressed as a percent (LM %) versus time in accordance with the present disclosure.

FIG. 4 demonstrates the enhancement in lumen maintenance for the $Al_2O_3$—$MoO_3$-pellet-doped "Exemplary Lamps" (denoted as B and C in FIG. 4) in contrast to the oxygen-free lamp (denoted as A in FIG. 4) and the $Al_2O_3$—CaO-pellet-doped lamps (denoted as D and E in FIG. 4). Although ceramic dosing aid with CaO additive is known in the art, the present system and method provides a combination of ceramic dosing aid, preferably with molybdenum-oxide (even more preferably, $MoO_3$). Tests confirm that molybdenum provides a more efficient wall-cleaning tungsten halogen chemical cycle in "Ultra" CMH lamps in comparison to conventional techniques. Based on the test results shown in FIG. 4, molybdenum-oxide provides much better lumen maintenance than the tungsten-oxide or CaO and oxygen-free lamps even at 1000, 2000 and 3000 hours.

Lamps designed in accordance with embodiments of the present disclosure have numerous technical and commercial advantages. For example, a technical advantage of the device and method is that it allows accurate and reproducible oxygen dosing of "Ultra" type ceramic metal halide lamps. The estimated oxygen dosing accuracy is much higher than that of the existing method used for processing these types of lamps.

Another technical advantage is that the oxygen dosing method according to the present teaching is independent of metal halide pellet dosing. Therefore, this allows for a single-pellet metal halide dosing process to be used. This feature reduces color variation, which is an inherent problem in existing "Ultra" lamps due to the current double-dosing pellet process.

A further technical advantage is that the method is compatible with existing manufacturing process such that it only needs to implement one additional step in the dosing process flow. The oxygen dosing method is also independent of nominal lamp wattage. Thus, the lamp can even be used if the "Ultra" CMH range is lowered down to 20 W or raised above 70 W.

Another technical advantage is that the molybdenum-oxide, which is the oxygen holding compound in the ceramic based dosing aid, is preferable to current components from the perspective that it provides optimum oxygen releasing rate, lower sensitivity on dosed quantity/accuracy, and a greater impact on color variability reduction. In addition to oxygen dispensing, the ceramic based dosing aid can also be used to introduce excess metal or even other radiating dose components of extremely low required quantities into the CMH discharge vessel.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

We claim:

1. A ceramic metal halide lamp, comprising:
    a discharge vessel; and
    an ionizable fill sealed within the discharge vessel, the ionizable fill comprising:
        an oxygen dispenser to introduce oxygen in a form of a pellet into the discharge vessel in a controlled manner to facilitate a tungsten halogen wall cleaning cycle; and
        the pellet comprises aluminum-oxide and molybdenum-oxide.

2. The lamp of claim 1, wherein the oxygen dispenser is controlled to accurately dose a concentration of the oxygen into the discharge vessel.

3. The lamp of claim 1, wherein the molybdenum-oxide is molybdenum-trioxide ($MoO_3$).

4. The lamp of claim 1, wherein the pellet comprises a spongy structure.

5. The lamp of claim 1, wherein the pellet comprises a spongy aluminum-oxide structure defining a plurality of interstitial voids containing a dosing component, which comprises the molybdenum-oxide.

6. The lamp of claim 1, wherein the pellet has a spheroidal configuration.

7. The lamp of claim 1, wherein the pellet has a solid aluminum-oxide sphere configuration containing a dose component deposited on an external surface of the pellet and the dose component comprises the molybdenum-oxide.

8. The lamp of claim 1, wherein the pellet further comprises an excess metal for gettering unwanted impurities in the discharge vessel.

9. The lamp of claim 1, wherein the pellet is selected to have a diameter smaller than a diameter of a dosing tube connected to the discharge vessel.

10. A method of forming a ceramic halide lamp, comprising:
    providing a discharge vessel; and
    sealing an ionizable fill within the discharge vessel, the ionizable fill comprising:
        an oxygen dispenser to introduce oxygen in a form of a pellet into the discharge vessel in a controlled manner to facilitate a tungsten halogen wall cleaning cycle; and
        the pellet comprises aluminum-oxide and molybdenum-oxide.

11. A method of claim 10, further comprising preparing the pellet using a pellet preparation process comprising the steps of:
    mixing aluminum-oxide and molybdenum-oxide with a binder to form a mixture;

pressing the mixture to form a pellet;
heat treating the pellet to remove the binder from the pellet; and
grinding the pellet to form the pellet having a spheroidal shape.

12. The method of claim 10, further comprising controlling the oxygen dispenser to accurately dose a concentration of the oxygen into the discharge vessel.

13. The method of claim 10, wherein the molybdenum-oxide is molybdenum-trioxide ($MoO_3$).

14. The method of claim 10, wherein the pellet has a spongy structure.

15. The method of claim 10, wherein the pellet has a spongy aluminum-oxide structure defining a plurality of interstitial voids containing a dosing component, which comprises the molybdenum-oxide.

16. The method of claim 10, wherein the pellet has a spheroidal configuration.

17. The method of claim 10, wherein the pellet is formed having a solid aluminum-oxide sphere configuration containing a dose component deposited on an external surface of the pellet and the dose component comprises the molybdenum-oxide.

18. The method of claim 10, further comprising selecting the pellet having a diameter smaller than a diameter of a dosing tube connected to the discharge vessel.

19. A method of preparing a dosing pellet, comprising:
mixing aluminum-oxide and molybdenum-oxide with a binder to form a mixture;
pressing the mixture to form a pellet;
heat treating the pellet to remove the binder from the pellet; and
grinding the pellet to form the pellet having a spheroidal shape.

* * * * *